United States Patent [19]
Enquist et al.

[11] Patent Number: 5,272,095
[45] Date of Patent: Dec. 21, 1993

[54] METHOD OF MANUFACTURING HETEROJUNCTION TRANSISTORS WITH SELF-ALIGNED METAL CONTACTS

[75] Inventors: Paul M. Enquist, Durham; David B. Slater, Jr., Raleigh, both of N.C.

[73] Assignee: Research Triangle Institute, Research Triangle Park, N.C.

[21] Appl. No.: 853,439

[22] Filed: Mar. 18, 1992

[51] Int. Cl.⁵ .................... H01L 21/265; H01L 29/70
[52] U.S. Cl. .................... 437/31; 437/89; 148/DIG. 72; 257/197; 257/586
[58] Field of Search ............ 437/31, 89, 129; 148/72; 257/197, 198, 586, 582

[56] References Cited

U.S. PATENT DOCUMENTS

| | | | |
|---|---|---|---|
| 3,994,758 | 11/1976 | Ogawa et al. | 437/912 |
| 3,997,367 | 12/1976 | Yau | 148/1.5 |
| 4,171,234 | 10/1979 | Nagata et al. | 437/912 |
| 4,283,483 | 8/1981 | Coane | 437/911 |
| 4,477,963 | 10/1984 | Cogan | 148/174 |
| 4,624,047 | 11/1986 | Tani | 148/175 |
| 4,683,487 | 7/1987 | Ueyanagi et al. | 257/197 |
| 4,706,378 | 11/1987 | Havemann | 437/24 |
| 4,728,606 | 3/1988 | Bukhman et al. | 437/33 |
| 4,731,340 | 3/1988 | Chang et al. | 437/22 |
| 4,794,093 | 12/1988 | Tong et al. | 437/203 |
| 4,824,805 | 4/1989 | Kajikawa | 437/228 |
| 4,859,618 | 8/1989 | Shikata et al. | 437/912 |
| 4,939,562 | 7/1990 | Adlerstein | 257/198 |
| 4,954,457 | 9/1990 | Jambotkar | 437/31 |
| 4,956,689 | 9/1990 | Yuan et al. | 357/34 |
| 4,959,326 | 9/1990 | Roman et al. | 437/912 |
| 4,965,218 | 10/1990 | Geissberger et al. | 437/41 |
| 4,965,650 | 10/1990 | Inada et al. | 257/393 |
| 4,980,739 | 12/1990 | Favreau | 257/588 |
| 4,997,778 | 3/1991 | Sim et al. | 437/912 |
| 5,024,958 | 6/1991 | Awano | 437/31 |
| 5,053,346 | 10/1991 | Yuan et al. | 437/22 |
| 5,110,751 | 5/1992 | Nakagawa | 437/912 |
| 5,139,968 | 8/1992 | Hayase et al. | 437/912 |

FOREIGN PATENT DOCUMENTS

| | | | |
|---|---|---|---|
| 0384113 | 8/1990 | European Pat. Off. | 257/197 |
| 0153430 | 9/1982 | Japan | 437/912 |
| 0318775 | 12/1988 | Japan | 357/16 |
| 0138751 | 5/1990 | Japan | 437/912 |
| 0161735 | 6/1990 | Japan | 437/912 |
| 0281632 | 11/1990 | Japan | 437/911 |
| 0008344 | 1/1991 | Japan | 437/911 |
| 0021031 | 1/1991 | Japan | 437/912 |
| 3023643 | 1/1991 | Japan | 437/912 |
| 4011741 | 1/1992 | Japan | 437/912 |

Primary Examiner—Olik Chaudhuri
Assistant Examiner—Long Pham
Attorney, Agent, or Firm—Oblon, Spivak, McClelland, Maier & Neustadt

[57] ABSTRACT

A method of manufacturing heterojunction transistors having self-aligned contacts. In manufacturing a heterojunction bipolar transistor, a collector and a base layer are deposited on a substrate. A masking layer is deposited on the base layer and selectively etched to form an aperture therein, exposing the base layer. An emitter having a mesa structure is grown epitaxially on the exposed base layer to produce lateral overhang portions. The overhang portions may be formed by continuing the epitaxial growth to form lateral overgrowth portions overlapping the masking material. The masking layer is removed and self-aligned contacts are formed to the base and emitter regions using the lateral overhang portions which provide separation between the emitter structure and the contacts to the base layer.

23 Claims, 5 Drawing Sheets

METHOD OF MANUFACTURING HETEROJUNCTION TRANSISTORS WITH SELF-ALIGNED METAL CONTACTS

BACKGROUND OF THE INVENTION

1. Field of the Invention

The present invention relates to a method of manufacturing heterojunction transistors with self-aligned contacts, and more particularly to a method of manufacturing mesa-type heterojunction bipolar transistors with self-aligned emitter and base metal contacts.

2. Discussion of the Background

A conventional method for manufacturing a vertical heterojunction bipolar transistor (HBT) is shown in FIGS. 1A-1C. In FIG. 1A, a n-type AlGaAs emitter layer 4, a p-type GaAs base layer 3 and a n-type GaAs collector layer 2 are formed on a semi-insulating substrate 1. Typically, all three layers are grown in one step by a method such as organometallic vapor phase epitaxy (OMVPE) or molecular beam epitaxy (MBE). A masking material 5 is deposited on emitter layer 4 and patterned using standard photolithographic techniques. The emitter layer 4 is then etched using masking layer 5 as a mask to provide the structure shown in FIG. 1B. Masking layer 5 is then removed and electrodes 6 and 7 are deposited using standard photolithographic techniques to provide the base and emitter contacts, respectively, as shown in FIG. 1C. The resulting device does not have self-aligned base and emitter contacts, and has a further disadvantage in that the emitter layer must be etched to expose the base layer. This can be a difficult process when very thin base layers (approximately 200 angstroms) are used or if it is desired to avoid the removal of any base material in order to optimize performance.

A second HBT according to the prior art is shown in FIG. 2. In manufacturing this structure, the base layer 3 is patterned after deposition, and then emitter layer 4 is grown by an overgrowth epitaxy technique to provide a planar surface. Regions 10 and 11 are formed by implantation of impurities such as Be, to provide a base contact via base electrode 6. Emitter contact 7 and collector contact 8 complete the structure. This device requires implantation to contact the base region and the base and emitter contacts are not self-aligned.

A prior art process having self-aligned features is disclosed in U.S. Pat. No. 4,731,340 to Chang et al. A photoresist layer is deposited on an AlGaAs layer used to form the emitter region. Apertures are etched through both the photoresist layer and the AlGaAs layer to expose the base region. Base metallization is deposited over the structure to provide self-aligned base metal contacts. The photoresist layer with the metal deposited thereon is subsequently removed to expose the emitter region. The emitter contact metal is defined by another photoresist mask and a subsequent metal deposition provides the emitter metal contact. While the process of '340 provides self-aligned base contacts, two separate photomasking and metal deposition steps are required as well as a complex combination of etching through both the photoresist layer and the AlGaAs layer. Moreover, the base contacts are aligned with the photoresist, and not the emitter layer.

A further method of forming an HBT according to the prior art is disclosed by Plumpton et al in U.S. Pat. No. 4,868,633. In FIGS. 5A and 6A-6C of '633, a pedestal comprised of layers 238, 240, 242 is selectively grown on a n+/n GaAs collector 234/236 on a GaAs substrate 132 masked by WSi:Zn layer 246. The growth of the layer pedestal avoids any deposition or growth on a WSi:Zn mask in one embodiment, or polycrystalline growth or deposition on a silicon dioxide mask in the second embodiment. The layer pedestal includes both base and emitter layers (or base and collector layers in the second embodiment) and does not require any penetration of the emitter layer (either by doping or etching) to contact the base, but the subsequently formed contacts must include photolithographic tolerances and hence be non-self-aligned as shown in FIG. 5A. This structure has a characteristic of self-aligned base metal in that the extrinsic base is WSi:Zn which has a significantly lower resistance than heavily doped GaAs and is thus significantly improved. However, a significant reduction of base-collector capacitance (or emitter-base capacitance in the second embodiment), largely determined by the approximate distance between the outside edges of the base metal 254 in FIG. 5A, which is also a characteristic of self-aligned base metal, is not achieved since this distance is increased by these photolithographic tolerances. This increase in capacitance lowers the performance of the transistor and the large number of process steps increases the complexity and cost.

SUMMARY OF THE INVENTION

Accordingly, one object of the present invention is to provide a novel method for manufacturing a heterojunction transistor having self-aligned contacts.

A second object of the invention is to provide a method of contacting subcutaneous layers.

A third object of the present invention is to provide a novel method for manufacturing a heterojunction bipolar transistor (HBT) having self-aligned emitter and base contacts.

Another object of the present invention is to provide a method for manufacturing an HBT without having to etch to the base layer or use ion implantation to provide a base contact.

A further object of the present invention is to provide a method for manufacturing an HBT with a minimum number of process steps.

Still another object of the present invention is to form lateral overhang portions providing a self-aligned process of manufacturing an HBT.

A still further object of the present invention is to provide a method for manufacturing an HBT with the use of lateral epitaxial overgrowth on a mask.

A still further object of the present invention is to provide a method for manufacturing an HBT whereby an optimum tradeoff between maximum current gain and minimum base resistance and collector (or emitter) capacitance parasitics is achieved.

These and other objects are achieved by a first embodiment of a method according to the invention which includes the steps of depositing a first layer of a first conductivity type on a substrate, depositing a second layer of a second conductivity type on the first layer, depositing a masking layer on the second layer and selectively etching the masking layer to form an aperture therein and exposing a portion of the second layer, epitaxially growing a third layer of a first conductivity type on the exposed portion of the second layer, forming lateral overhang portions in the third layer, removing the masking material, and forming self-aligned contacts on the second and third layer using the lateral overhang portions.

The lateral overhang portions may be formed by continuing the epitaxial growth to overlap the masking material to give lateral overgrowth portions in contact with an upper surface of the masking material.

The epitaxial growing and forming lateral overhang portion steps may include selective epitaxy using organometallic chemical vapor deposition to form a mesa structure. Forming the self-aligned contacts includes depositing metal on the second and third layers in a direction substantially normal to a plane of the second layer, a lateral length of the lateral overhang portions determining a separation between the third layer and contacts on the second layer.

The aperture formed in the masking layer may be oriented with respect to a predetermined crystallographic plane of the second layer, this predetermined crystallographic plane being substantially parallel with a longitudinal dimension of the aperture such that significant overgrowth is achieved around a majority of the aperture periphery to facilitate the self-aligned contacts on the second layer.

The method according to a first embodiment of the invention may further include the steps of etching through the second layer to expose a portion of the first layer, forming a contact on the first layer, depositing a planarizing film on the transistor, opening apertures in the film to expose the contacts to the first, second and third layers, and forming respective interconnections on the contacts to the first, second and third layers.

In a second embodiment of the method according to the invention, after forming the lateral overhang portions according to the first embodiment of the invention, the masking material is etched to remove a portion thereof and form an undercut region between the masking material and the lateral overhang portion, first metal is deposited over the masking layer and the third layer, the masking layer is lifted off, and second metal is deposited over the transistor to form self-aligned contacts to the second layer using the lateral overhang portions.

The epitaxially growing and forming lateral overhang portion steps may include selective epitaxy using organometallic chemical vapor deposition to form a mesa structure, and the depositing second metal may include depositing second metal on the second and third layers in a direction substantially normal to a plane of the second layer, a lateral length of the lateral overhang portions determining a separation between the third layer and contacts on the second layer.

The second embodiment according to the invention may also include the steps of orienting the aperture in the masking layer with respect to a predetermined crystallographic plane of the second layer, the predetermined crystallographic plane being substantially parallel with a longitudinal dimension of the aperture such that significant overgrowth is achieved around a majority of the aperture periphery to facilitate the self-aligned contacts on the second layer.

The second embodiment according to the invention may further include the steps of etching through the second layer to expose a portion of the first layer, forming a contact on the first layer, depositing a planarizing film on the transistor, opening apertures in the film to expose the contacts to the first, second and third layers, and forming respective interconnections on the contacts to the first, second and third layers.

In the first and second embodiments, orienting the aperture in the masking layer with respect to a predetermined crystallographic plane ensures that the lateral overhang portions are rapidly and reliably formed over a majority of the aperture periphery, thereby providing a simple manufacturing method for forming self-aligned contacts to the base and emitter regions of an HBT.

As one example of the first and second embodiments of the method according to the invention, the substrate is formed of a semi-insulating GaAs material, the first layer is a GaAs collector layer, the second layer is a GaAs base layer, and the third layer is an AlGaAs/GaAs emitter layer.

A third embodiment of the method according to the invention includes the steps of completely etching the mask in the aperture followed by a partial etching of the second layer within said aperture to form a cavity therein and epitaxially growing the third layer in the cavity. This embodiment allows a differentiation in thickness of the second layer between a region under the epitaxially grown third layer and regions outside of this first region.

A variation of the third embodiment which also allows a differentiation in thickness of the second layer between a region under the epitaxially grown third layer and regions outside of this first region is where the initial growth comprises growth of first, second and third layers. The emitter (third layer) region is then defined with the masking material and an etch to anywhere in the second layer. The second growth then comprises growth on the second layer to extend the thickness of the second layer above and over the third layer.

A method according to the fourth embodiment of the invention includes etching the masking layer to form an aperture having sloping sidewalls therein, followed by selective epitaxy to form the third layer. The sloping sidewalls of the third layer provides the overhang to give a separation between the self-aligned contacts.

In all of the embodiments, the initial growth of the second layer can be terminated with a suitable passivating layer. Prior to the second growth, this layer may be removed in the aperture. The resulting structure has the potential for increased gain since the surface of the second layer is not exposed which otherwise increases gain reducing minority carrier recombination.

The method according to the invention is applied to a heterojunction electron transistor in a fifth embodiment where a first layer, a first barrier layer, and a second layer are successively deposited on a substrate. A masking layer is deposited on the second layer and an aperture is formed therein to expose a portion of the second layer. A second barrier layer is grown on the exposed of the second layer, and the third layer is epitaxially grown on the second barrier layer. Lateral overhang portions are formed in the third layer followed by removing the masking layer and forming self-aligned contacts on the second and third layers using the lateral overhang portions.

BRIEF DESCRIPTION OF THE DRAWINGS

A more complete appreciation of the invention and many of the attendant advantages thereof will be readily attained a the same becomes better understood by reference to the following detailed description when considered in connection with the accompanying drawings, wherein.

DESCRIPTION OF THE PREFERRED EMBODIMENTS

Figure 3A:
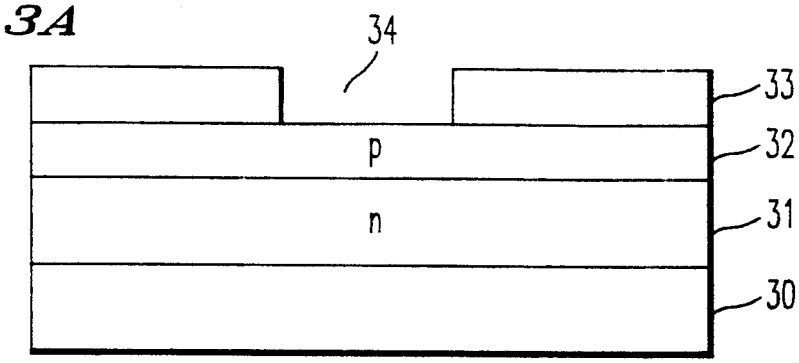
FIGS. 3A-3D are sectional views illustrating a first embodiment of the method according to the present invention.
Figure 3B:
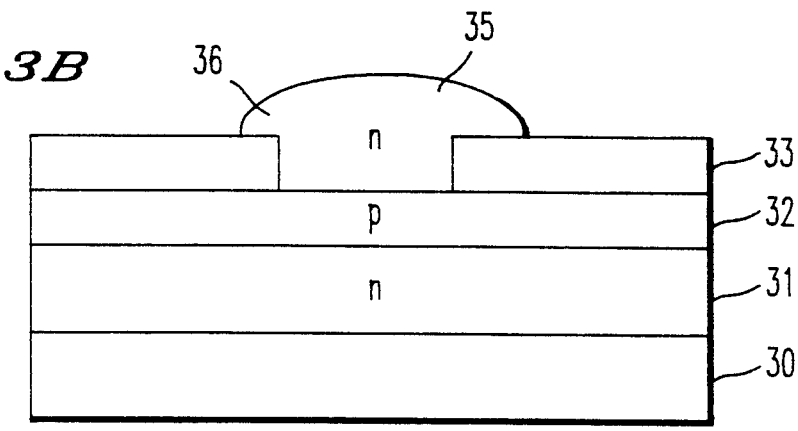

Referring now to the drawings, wherein like reference numerals designate identical or corresponding parts throughout the several views, and more particularly to FIG. 3A thereof, a first embodiment of the method according to the present invention is illustrated. After depositing n-type collector layer 31 and p-type base layer 32 on a semi-insulating GaAs substrate 30 using organometallic vapor phase epitaxy (OMVPE) or molecular beam epitaxy (MBE), for example, a masking layer 33 formed of a material such as silicon nitride or silicon dioxide to a thickness of 3000 Å, for example, is deposited on base layer 32. Masking layer 33 is subsequently patterned using conventional photolithographic techniques and etched to form opening 34, using a conventional etching technique such as dilute aqueous HF or reactive ion etching. The structure shown in FIG. 3A is then subjected to a selective regrowth of an AlGaAs/GaAs emitter region 36 on base layer 32 in the opening 34. The selective regrowth is carried out, for example, via OMVPE which results in single crystal epitaxial material being grown without any deposition on the masking material 33. The selective regrowth of the emitter is continued to produce a lateral overhang 36 over masking layer 33, as shown in FIG. 3B. This process uses precursors in a molecular versus atomic form such that the surface mobility of these precursors is enhanced, this enhancement allowing crystal growth in unmasked regions and inhibiting deposition in masked regions and enabling formation of a lateral overhang on the mask when the height of the crystal growth in unmasked regions exceeds the height of the mask.

For example, the second growth can be carried out in a quartz or stainless steel vessel which contains a susceptor which holds the substrate which can be heated. The temperature of the second growth can be between 550° and 800° C. The pressure in the vessel can be 0.1 atmospheres. Furthermore, the source materials can be trimethylgallium and arsine for the growth of GaAs, and trimethylgallium, trimethylaluminum and arsine for the growth of AlGaAs. Disilane and carbon tetrachloride can be used for n- and p-type dopants respectively. These source materials can be balanced in hydrogen. Typical flows of these source materials are 18 slm hydrogen, 20 sccm hydrogen passed through trimethylgallium at −10° C., 1-100 sccm of 0.5% carbon tetrachloride balanced with hydrogen, depending on desired doping concentration, and 1-100 sccm of 5 ppm disilane balanced with hydrogen, depending on desired doping concentration. The selectivity of achieving crystal growth nucleated on the masked areas is enhanced by minimizing the masked area and using lower pressures, higher temperatures and lower aluminum concentrations (if AlGaAs is desired).

In this embodiment, overhangs 36 are provided by lateral overgrowth portions of the emitter mesa being in contact with masking layer 33. Subsequently, masking layer 33 is removed selectively, to expose base layer 32. The emitter 35 and base layer 32 are then simultaneously metallized to provide base contacts 37 and emitter contact 38. The contacts to the base layer are formed without having to etch through the emitter layer to expose the base region, or implant through the emitter layer to provide a contact to a subcutaneous base layer.

Figure 1A:
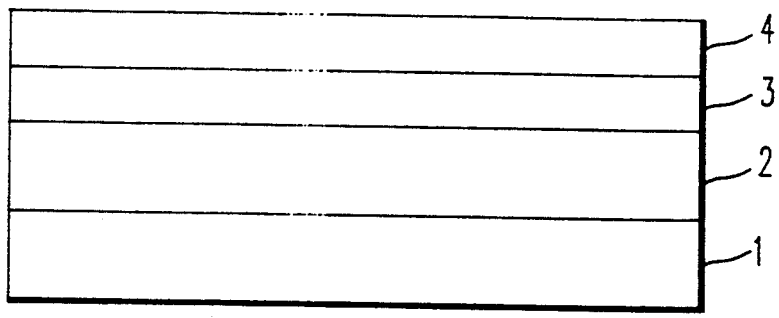
FIGS. 1A-1C are sectional views illustrating a method of forming a heterojunction bipolar transistor according to the prior art.
Figure 1B:
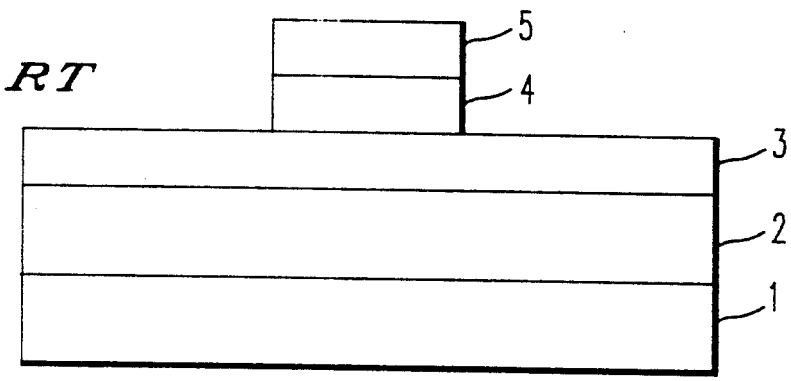
Figure 1C:
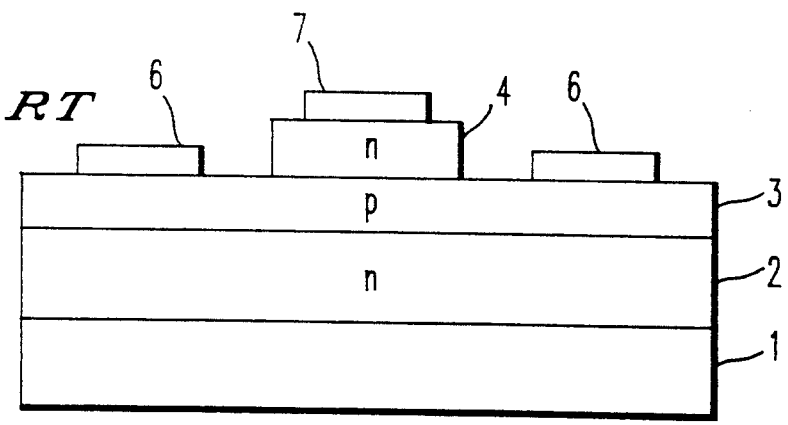
Figure 2:
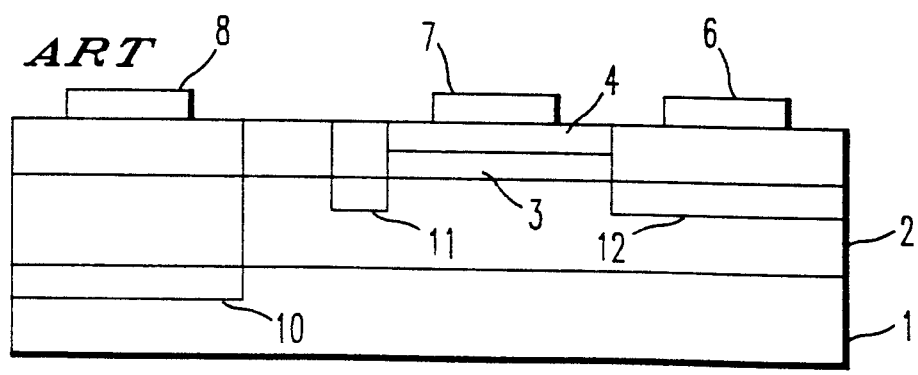
FIG. 2 is a sectional view illustrating a heterojunction bipolar transistor according to the prior art.

The selective epitaxy with lateral overgrowth followed by a simultaneous metallization to form the emitter and base contacts provides greatly improved manufacturability of HBTs since the number of process steps is minimized. The difficult step of etching through an emitter layer to reach a base layer, which is especially difficult when thin base layers are used, is avoided. Further, the method according to the present invention avoids additional complicated masking and ion implantation steps to form a contact to a subcutaneous base layer (see FIG. 2). The lateral overgrowth allows a single metalization step to form self-aligned contacts to the base and emitter regions. The self-aligned nature of the method according to the invention greatly simplifies the overall process compared to the prior art, and results in an efficient and highly manufacturable process for producing HBTs of high reliability.

Figure 3C:
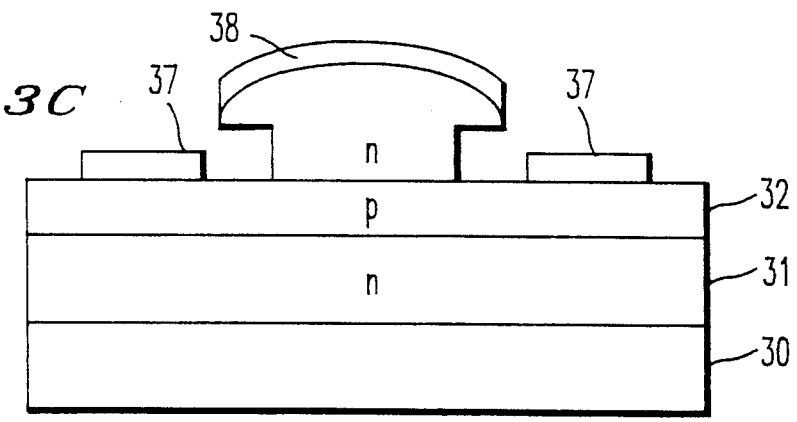
Figure 3D:
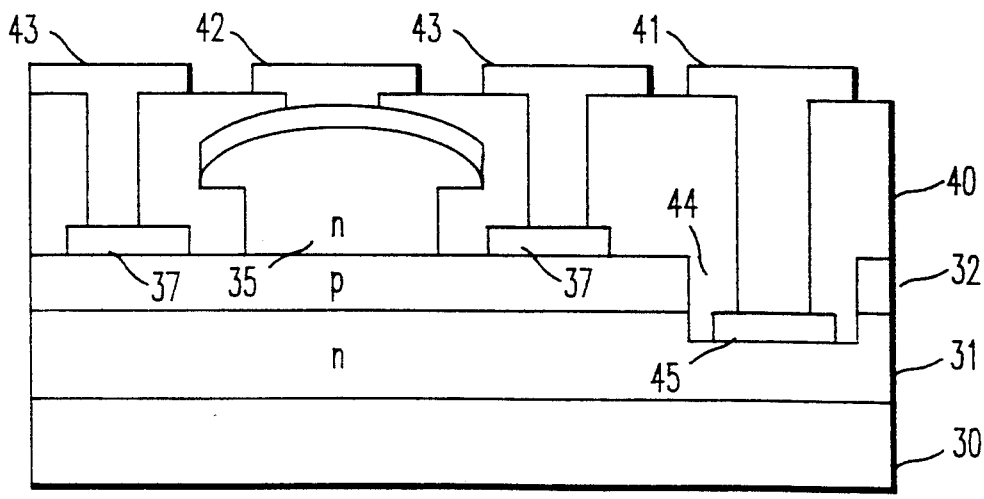

The method according to the first embodiment of the invention is completed by a conventional collector etch to contact the collector layer 31, forming a cavity 44, depositing collector metal 45, planarizing the device by depositing layer 40, and providing collector interconnect 41, emitter interconnect 42 and base interconnects 43, as shown in FIG. 3D.

Figure 4A:
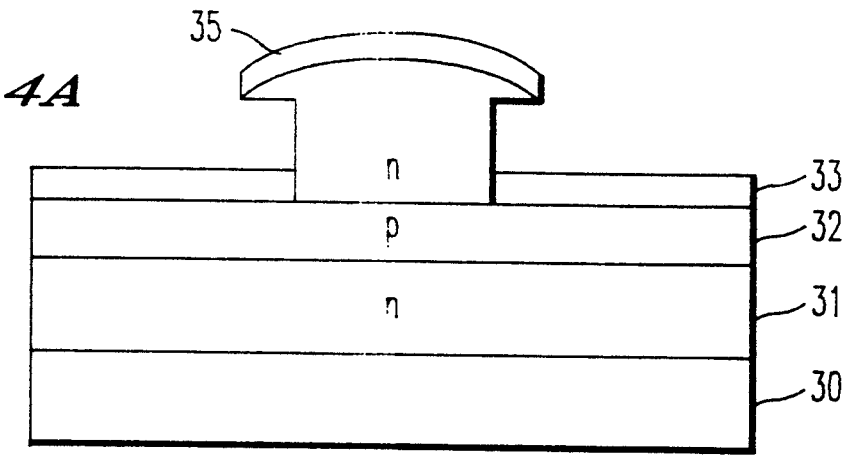
FIGS. 4A-4C are sectional views illustrating a second embodiment of the method according to the present invention.
Figure 4B:
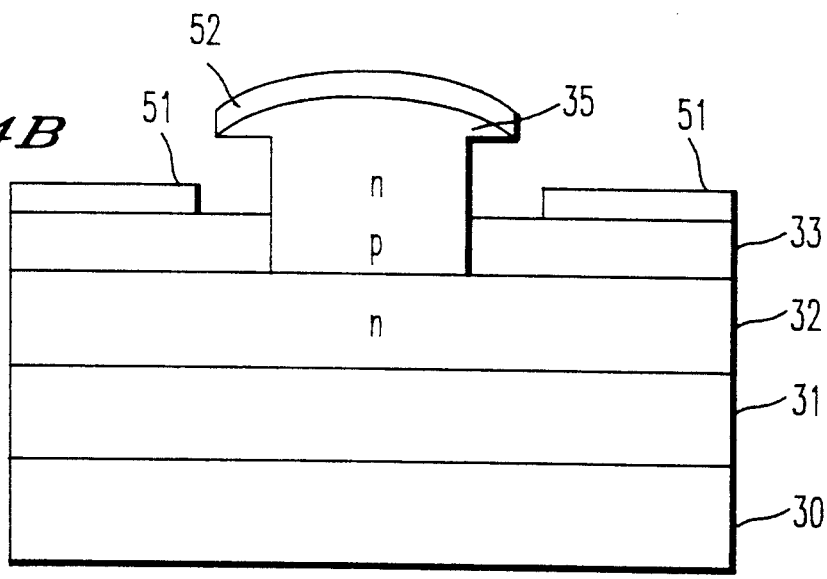
Figure 4C:
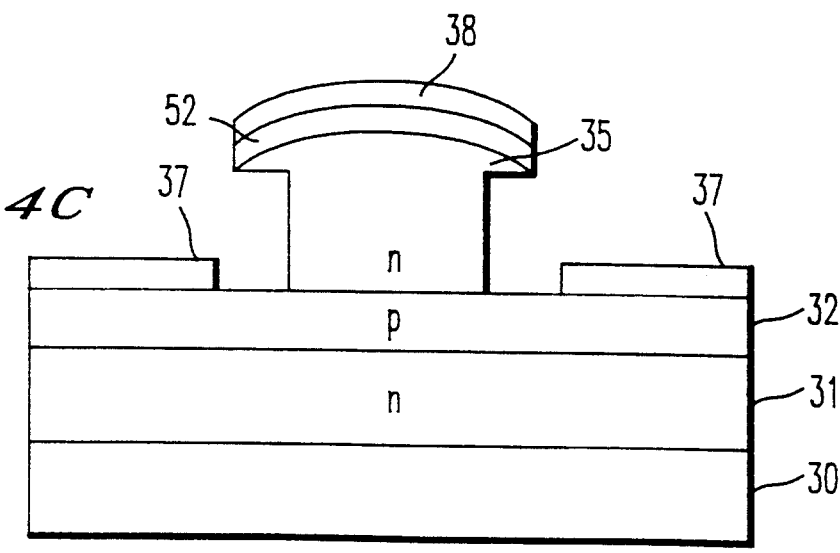

A second embodiment of the present invention will be described in relation to FIGS. 4A-4C. The second embodiment is identical to the first embodiment up to the steps shown by FIG. 3B, the description of which will be omitted for brevity. The structure shown in FIG. 3B is subjected to a partial etch of the masking layer 33 to produce an undercut 50, as shown in FIG. 4A. The height of undercut 50 should be such that a subsequent metallization step forms separated metal portions 51 and 52, without any bridging therebetween. The nitride is then removed thereby lifting off the undesired metal portions 51 and exposing base layer 32. A metallization step is then performed over the emitter and base regions resulting in the same structure as shown in FIG. 3C. A variation of this embodiment is to mask a center portion of the emitter layer metallization 52 using conventional photolithography prior to metallization 38 allowing subsequent emitter layer interconnect 42 to contact the emitter layer metallization 52 directly without compromising the self-aligned nature of the base layer metallization 37. The second embodiment of the method according to the present invention is then completed by the identical steps as illustrated in FIG. 3D. The second embodiment advantageously provides two different types of metal contacts to the base and emitter layers to improve the performance of the HBT formed using the method according to the invention.

As is well known in the art, different crystallographic planes have different crystal growth rates. The present invention takes advantage of this phenomenon by orienting the apertures 34 in a desired crystallographic plane such that the lateral overgrowth 36 occurs. This desired plane can be substantially parallel with a longitudinal dimension of the aperture such that significant overgrowth is achieved around a majority of the aperture periphery to facilitate formation of the self-aligned contacts on the second layer. This preferable orientation promotes the lateral overgrowth 36 during the selective epitaxy step and ensures that the lateral overgrowth portions are rapidly and reliably formed over a majority of the aperture periphery, thereby providing a simple manufacturing method for forming self-aligned contacts to the base and emitter regions of an HBT.

The amount of overgrowth which will provide self-aligned emitter and base contact while avoiding shorting of the base contact to the emitter mesa will depend on a number of factors. Preferably, the amount of overgrowth should be kept as little as possible, but enough to reduce the amount of shorting between the base contacts and emitter mesa to a tolerable level considering normal manufacturing yield requirements. Further, depositing the metal forming the emitter and base contacts in a highly directional manner, e.g., in a direction as close to normal with respect to the plane of the surface of the base layer, allows minimal lateral overgrowth of the emitter mesa. This can be accomplished, for example, by adjusting the distance between the evaporation source and the HBT in a conventional evaporation apparatus.

The amount of lateral overgrowth will also depend upon the height of the emitter mesa, as a taller emitter mesa will require a greater amount of lateral overgrowth than a shorter emitter mesa. No exact relationship between height of the mesa and amount of lateral overgrowth exists, but it is believed that the amount of overgrowth is apparent to one of ordinary skill in the art based upon the HBT device performance requirements, ease of planarizing the resultant structure, etc.

By minimizing the amount of lateral overgrowth, the distance between the emitter mesa and the adjacent base contacts is also minimized. The HBT formed by the method of the present invention obtains lower base resistance as the length of the lateral current flow between the base and emitter is reduced. The base-collector capacitance is also lowered. The lowering of the base resistance and base-collector capacitance optimizes the performance of the device and allows a greater flexibility in manufacturing the HBT.

The amount of overgrowth can be further determined by an optimum spacing between the base layer metal and the emitter layer in that a minimum spacing is desired to minimize parasitics (base resistance and base-collector capacitance) and obtain maximum speed, but a finite spacing is desired to avoid excessive minority carrier recombination from the emitter layer with the base layer metal. This spacing can be varied continuously by the amount of overgrowth and can hence be optimally obtained by this invention.

Figure 5:
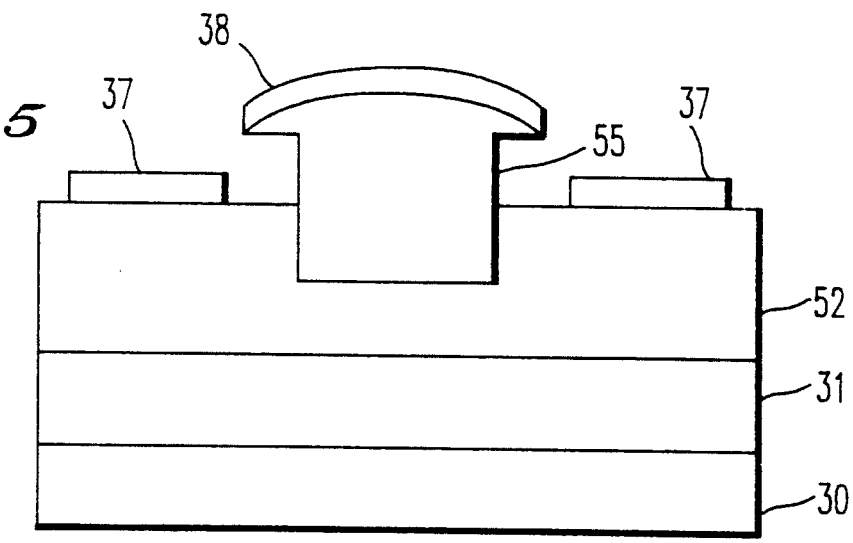
FIG. 5 is a sectional view illustrating a third embodiment according to the present invention.

In a third embodiment of the method according to the invention, which will be described in relation to FIG. 5, the base layer is grown substantially thicker than in the first and second embodiments. Furthermore, after the aperture has been etched and the base layer exposed in the first and second embodiments, the base layer can be etched such that its thickness is similar to that in the first and second embodiments. This will result in an intrinsic (nominally within the aperture) base layer thickness and hence base layer transit time similar to that in the first and second embodiments. Simultaneously, this will also yield an extrinsic (nominally outside the aperture) base layer which is substantially thicker than that in the first and second embodiments resulting in a significant reduction in the extrinsic base layer resistance and hence improved performance. This embodiment avoids the tradeoff between low intrinsic base layer transit time which requires a thin base layer and low extrinsic base layer resistance which requires a thick base layer.

Figure 6A:
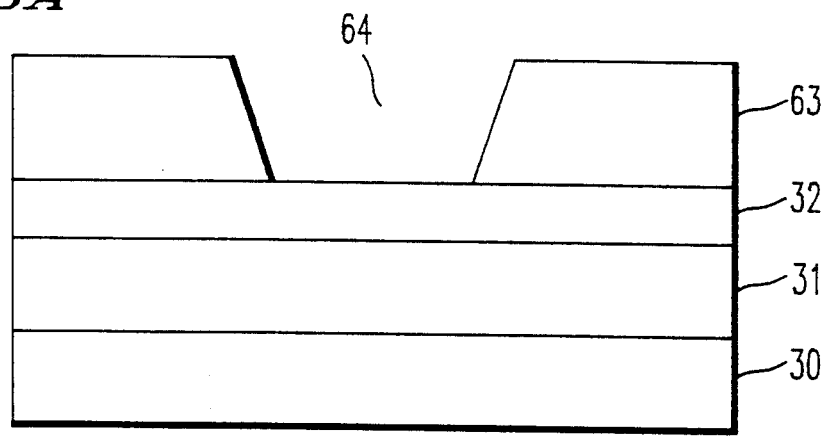
FIGS. 6A and 6B are sectional views illustrating a fourth embodiment according to the present invention.
Figure 6B:
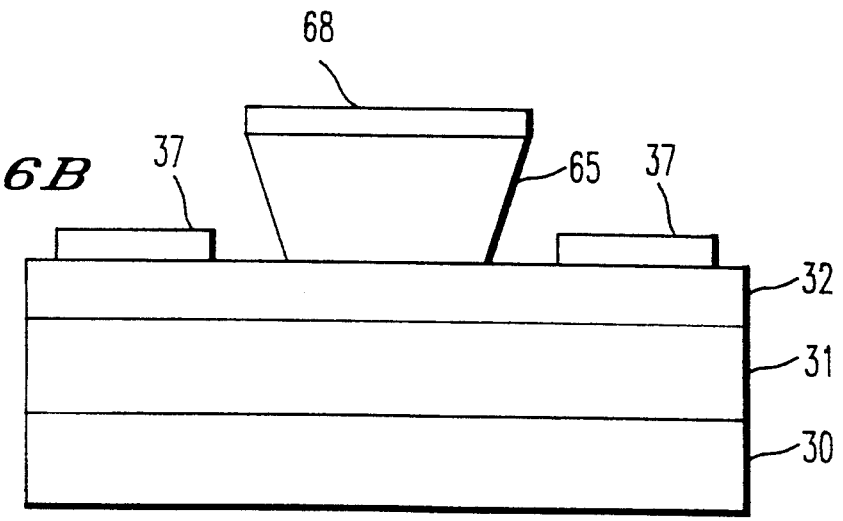

A fourth embodiment of the method according to the invention having an alternative method of forming the self-aligned emitter and base contacts will be described in relation to FIGS. 6A–6B. As shown in FIG. 6A, masking layer 63 is etched to form aperture 64 having sloping side walls. Selective epitaxy is carried out to form emitter mesa 65. The masking layer 63 is subsequently removed and metal is deposited to form base contact 37 and emitter contact 68. The sloping sidewalls of the emitter mesa provides the overhangs to give the necessary base contact-emitter mesa separation as well as the self-aligned nature of the contacts.

The present invention can be practiced upon any device which requires contact to a subcutaneous layer, especially those layers which are thin or otherwise difficult to contact. In a fifth embodiment of the method according to the invention, the device structure to be fabricated is a hot electron transistor (HET) or resonant tunneling hot electron transistor (RHET). This transistor is a unipolar device containing three layers of one conductivity type separated by undoped barrier layers with a larger bandgap. Contact to the second of the three layers is required to obtain transistor action. However, the second of the three layers is typically very thin ($<500$ Å) and difficult to contact by conventional methods.

Figure 7A:
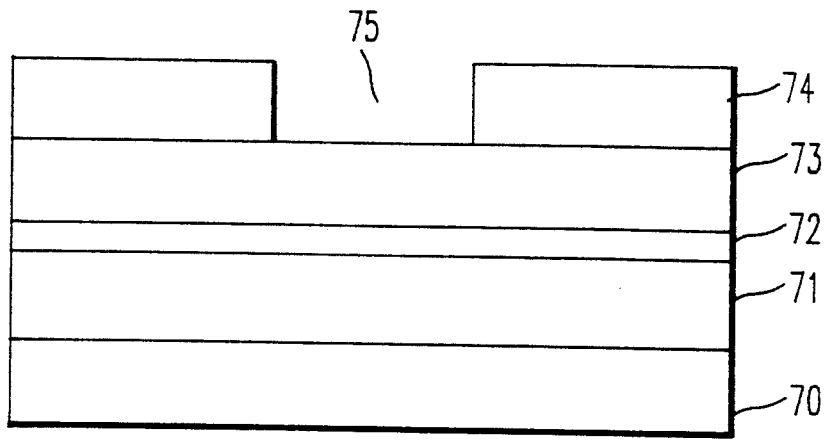
FIGS. 7A and 7B are sectional views illustrating a fifth embodiment according to the present invention.
Figure 7B:
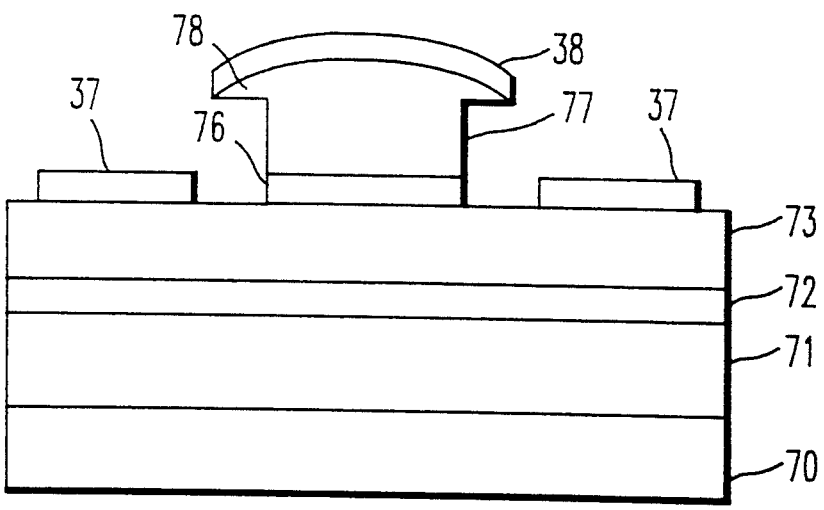

Referring to FIGS. 7A and 7B, the method according to the fifth embodiment of the present invention will be described. An n-type GaAs layer 71 is formed on a semi-insulating GaAs substrate 70, in the same manner as in the previous embodiments. An AlGaAs barrier layer 7 is then deposited on layer 71, and a second n-type GaAs layer 73 is formed on barrier layer 72. These layers can be formed, for example, by MBE or OMVPE as in the previous embodiments. A masking layer 74 is subsequently formed on layer 73, and an aperture 75 is formed therein by conventional etching techniques.

Referring to FIG. 7B, a second AlGaAs barrier layer 76 is first formed in the aperture 75 on layer 73, followed by the epitaxial growth of a third n-type GaAs layer 77. The epitaxial growth is carried out to form lateral overhang portions. In this embodiment, the lateral overhang portions are formed by the lateral overgrowth technique to provide overgrowth portions 78. The layers 76 and 77 could also be formed according to the fourth embodiment. The masking layer 74 is subsequently removed and self-aligned metal contacts 37 and 38 are formed on the structure in the same manner as in the prior embodiments To complete the structure, layers 73 and 72 are etched to expose layer 71 and a contact is formed thereto in a manner similar to contacting layer 31 as shown in FIG. 3D.

The fifth embodiment may also be modified by forming the masking layer 74 in the same manner as the fourth embodiment to provide sloping sidewalls resulting in an emitter mesa having sloping sidewalls providing self-aligned contacts as well as the proper third layer-contact separation. The fifth embodiment may also be modified according to the second embodiment to provide different metal layers to different layers of the HET.

While the embodiments of the present invention illustrate depositing GaAs on a semi-insulating substrate followed by the selective epitaxy of an AlGaAs/GaAs emitter, it is to be understood that the present invention is in no way limited to these materials and other materials apparent to those of ordinary skill in the art may be employed. For example, the method according to the present invention may also be implemented in silicon, where a Si emitter may be grown on a Si/Ge base and Si/Ge or Si collector layers. Other III-V materials may be used where the emitter material has a wider band gap than the base material. The selection of materials will be dependent upon the required device characteristics and performance, which is believed apparent to one of ordinary skill in the art. Further, the third, fourth and fifth embodiments can be modified by using the two-step metallization according to the second embodiment, as is apparent to on of ordinary skill in the art.

While the embodiments of the present invention are directed to forming an HBT in the emitter configuration, the present invention is also capable of forming an HBT in the emitter down configuration. For example, in the first embodiment as shown in FIGS. 3A-3C, collector and base layers are deposited successively on the substrate 30 followed by the epitaxial growth of the emitter 35. In the emitter down configuration, a composite AlGaAs/GaAs emitter is deposited on the substrate followed by the deposition of the base layer. Subsequently, the collector is grown in the same manner as the emitter of the first embodiment.

Further, while the method according to the invention discloses forming an HBT device, it is to be understood that Npn or Pnp HBT devices may be formed by the method according to the present invention. The material of the masking layer is also not limited to the materials disclosed, but any material having a suitable etch selectivity to the base material and which inhibits the crystal growth thereon during the selective epitaxy step may be used.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A method of manufacturing a heterojunction bipolar transistor, comprising:
   depositing a first layer of a first conductivity type on a substrate;
   depositing a second layer of a second conductivity type on said first layer;
   depositing a masking layer on said second layer;
   selectively etching said masking layer to form an aperture therein and exposing a portion of said second layer;
   epitaxially growing a third layer having lateral overhang portions of said first conductivity type on said exposed portion of said second layer;
   removing said masking layer; and
   forming self-aligned contacts on said second and third layers using said lateral overhang portions.

2. A method as recited in claim 1, wherein said forming lateral overhang portions comprises:
   epitaxially growing said third layer using organometallic chemical vapor deposition to form a mesa having a larger lateral dimension at an upper portion thereof than at a portion on contact with said second layer.

3. A method as recited in claim 2, wherein said forming lateral overhang portions comprises:
   forming lateral overgrowth portions overlapping and in contact with said masking layer by continuing said epitaxial growth.

4. A method as recited in claim 2, wherein forming said aperture comprises forming an aperture with sidewalls being deviated from a vertical direction by a desired angle.

5. A method as recited in claim 2, wherein said step of forming said self-aligned contacts comprises:
   depositing metal on said second and third layers in a direction substantially normal to a plane of said second layer, a length of said lateral overhang portions determining separation between said third layer and said contacts on said second layer.

6. A method as recited in claim 1, further comprising:
   etching through said second layer to expose a portion of said first layer;
   forming a contact on said first layer;
   depositing a planarizing film;
   opening apertures in said film to expose said contacts to said first, second and third layers; and
   forming respective interconnections on said contacts to said first, second and third layers.

7. A method as recited in claim 1, comprising:
   orienting said aperture in said masking layer with respect to a predetermined crystallographic plane of said second layer.

8. A method as recited in claim 7, wherein said orienting step comprises:
   orienting said aperture with respect to a crystallographic plane of said second layer having a larger growth rate in a direction of lateral overhang than in a longitudinal direction of said aperture.

9. A method as recited in claim 1, comprising:
   said substrate being formed of semi-insulating GaAs material;
   depositing a GaAs collector layer as said first layer;
   depositing a GaAs base layer as said second layer; and growing an AlGaAs/GaAs emitter layer as said third layer.

10. A method as recited in claim 1, comprising:
    said substrate being formed of semi-insulating GaAs material;
    depositing an AlGaAs/GaAs emitter layer as said first layer;
    depositing a GaAs base layer as said second layer; and
    growing a GaAs collector layer as said third layer.

11. A method as recited in claim 1, comprising:
    continuing said selective etching to etch said second layer and form a cavity therein; and
    epitaxially growing said third layer in said cavity.

12. A method as recited in claim 1, wherein said step of forming self-aligned contacts comprises:
    selectively etching said masking layer to remove a portion thereof to form an undercut region between said masking layer and said lateral overhang portions;

depositing first metal over said masking layer and said third layer;

lifting off said masking layer; and depositing second metal over said transistor to form self-aligned contacts to said second layer using said lateral overhang portions.

13. A method of manufacturing a heterojunction transistor, comprising:

depositing a first layer of a first conductivity type on a substrate;

depositing a first barrier layer on said first layer;

depositing a second layer of a first conductivity type on said first barrier layer;

depositing a masking layer on said second layer;

selectively etching said masking layer to form an aperture therein and exposing a portion of said second layer;

growing a second barrier layer on said exposed portion of said second layer;

epitaxially growing a third layer of said first conductivity type on said second barrier layer;

forming lateral overhang portions in said third layer;

removing said masking layer; and forming self-aligned contacts on said second and third layers using said lateral overhang portions.

14. A method as recited in claim 13, wherein said forming lateral overhang portions comprises:

epitaxially growing said third layer using organometallic chemical vapor deposition to form a mesa having a larger lateral dimension at an upper portion thereof than at a portion in contact with said second layer.

15. A method as recited in claim 14, wherein said forming lateral overhang portions comprises:

forming lateral overgrowth portions overlapping and in contact with said masking layer by continuing said epitaxial growth.

16. A method as recited in claim 14, wherein forming said aperture comprises forming an aperture with sidewalls being deviated from a vertical direction by a desired angle.

17. A method as recited in claim 14, wherein said step of forming said self-aligned contacts comprises:

depositing metal on said second and third layers in a direction substantially normal to a plane of said second layer, a length of said lateral overhang portions determining separation between said third layer and said contacts on said second layer.

18. A method as recited in claim 13, comprising:

orienting said aperture in said masking layer with respect to a predetermined crystallographic plane of said second layer.

19. A method as recited in claim 13, wherein said orienting step comprises:

orienting said aperture with respect to a crystallographic plane of said second layer having a larger growth rate in a direction of lateral overhang than in a longitudinal direction of said aperture.

20. A method as recited in claim 13, comprising:

said substrate being formed of semi-insulating GaAs material;

depositing a GaAs layer as each of said first and second layers;

depositing an AlGaAs layer as said first barrier layer;

growing an AlGaAs layer as said second barrier layer; and growing a GaAs layer as said third layer.

21. A method as recited in claim 13, further comprising:

etching through said second layer and said first barrier layer to expose a portion of said first layer;

forming a contact on said first layer;

depositing a planarizing film;

opening apertures in said film to expose said contacts to said first, second and third layers; and forming respective interconnections on said contacts to said first, second and third layers.

22. A method of manufacturing a heterojunction bipolar transistor, comprising:

depositing a first layer of a first conductivity type on a substrate;

depositing a second layer of a second conductivity type on said first layer;

depositing a masking layer on said second layer;

selectively etching said masking layer to form an aperture therein and exposing a portion of said second layer;

forming a third layer of said first conductivity type on said exposed portion of said second layer and forming lateral overhang portions laterally overhanging said masking layer in a single step;

removing said masking layer; and forming self-aligned contacts on said second and third layers using said lateral overhang portions.

23. A method as recited in claim 1, wherein said epitaxially growing comprises:

growing said third layer only in said aperture; and forming said lateral overhang portions by lateral growth of said third layer form said aperture overlapping an upper surface of said masking layer.

* * * * *